United States Patent
Li

(10) Patent No.: US 11,830,940 B2
(45) Date of Patent: Nov. 28, 2023

(54) SEMICONDUCTOR DEVICE INCLUDING HIGH ELECTRON MOBILITY TRANSISTOR OR HIGH HOLE MOBILITY TRANSISTOR AND METHOD OF FABRICATING THE SAME

(71) Applicant: GUANGDONG ZHINENG TECHNOLOGIES, CO. LTD., Guangzhou (CN)

(72) Inventor: Zilan Li, Guangzhou (CN)

(73) Assignee: GUANGDONG ZHINENG TECHNOLOGIES, CO. LTD., Guangzhou (CN)

(*) Notice: Subject to any disclaimer, the term of this patent is extended or adjusted under 35 U.S.C. 154(b) by 40 days.

(21) Appl. No.: 16/811,898

(22) Filed: Mar. 6, 2020

(65) Prior Publication Data

US 2020/0328297 A1    Oct. 15, 2020

(30) Foreign Application Priority Data

Apr. 12, 2019    (CN) .......................... 201910291624.6

(51) Int. Cl.
| | |
|---|---|
| *H01L 29/778* | (2006.01) |
| *H01L 29/16* | (2006.01) |
| *H01L 29/20* | (2006.01) |
| *H01L 29/66* | (2006.01) |
| *H01L 29/06* | (2006.01) |
| *H01L 29/04* | (2006.01) |

(52) U.S. Cl.
CPC ........ *H01L 29/7786* (2013.01); *H01L 29/045* (2013.01); *H01L 29/0657* (2013.01); *H01L 29/1608* (2013.01); *H01L 29/2003* (2013.01); *H01L 29/66431* (2013.01); *H01L 29/66462* (2013.01)

(58) Field of Classification Search
CPC ............ H01L 29/66666; H01L 29/7788–7789
See application file for complete search history.

(56) References Cited

U.S. PATENT DOCUMENTS

| | | | |
|---|---|---|---|
| 9,978,872 B1* | 5/2018 | Hahn | H01L 21/8252 |
| 2011/0169012 A1* | 7/2011 | Hersee | H01L 21/8252 257/76 |
| 2014/0170998 A1* | 6/2014 | Then | H01L 29/785 455/127.2 |
| 2014/0209893 A1* | 7/2014 | Okamoto | H01L 29/7787 257/43 |
| 2017/0117398 A1* | 4/2017 | Xiao | H01L 29/127 |
| 2018/0130801 A1* | 5/2018 | Rachmady | H01L 27/0924 |
| 2018/0219087 A1* | 8/2018 | Dasgupta | H01L 21/02639 |
| 2019/0288101 A1* | 9/2019 | Longobardi | H01L 29/4236 |
| 2020/0044066 A1* | 2/2020 | Suzuki | H01L 29/7789 |
| 2020/0185492 A1* | 6/2020 | Kimura | H01L 29/1608 |
| 2020/0411677 A1* | 12/2020 | Then | H01L 27/092 |

* cited by examiner

*Primary Examiner* — Eric A. Ward
(74) *Attorney, Agent, or Firm* — Seed IP Law Group LLP

(57) ABSTRACT

The present disclosure relates to a semiconductor device and a method of fabricating the same. The semiconductor device includes: a substrate including a vertical interface; a channel layer disposed outside the vertical interface; and a channel supply layer disposed outside the channel layer; wherein at least one of a vertical two-dimensional electron gas 2DEG and two-dimensional hole gas 2DHG is formed in the channel layer adjacent to an interface between the channel layer and the channel supply layer.

21 Claims, 12 Drawing Sheets

SEMICONDUCTOR DEVICE INCLUDING HIGH ELECTRON MOBILITY TRANSISTOR OR HIGH HOLE MOBILITY TRANSISTOR AND METHOD OF FABRICATING THE SAME

FIELD OF THE DISCLOSURE

The present disclosure relates to the technical field of semiconductors, and in particular to a semiconductor device and a method of fabricating the same.

BACKGROUND OF THE DISCLOSURE

Group III nitride semiconductors are important semiconductor materials, including AlN, GaN, InN and compounds of these materials, such as AlGaN, InGaN, AlInGaN and the like. Due to their advantages of direct band gap, wide forbidden band and high breakdown electric field intensity, Group III nitride semiconductors represented by GaN have broad application prospects in the fields of light-emitting devices, power electronics and radio frequency devices.

Unlike conventional non-polar semiconductor materials such as Si, Group III nitride semiconductors have polarity; in other words, they are polar semiconductor materials. Polar semiconductors have many unique properties. Particularly importantly, fixed polarized charges are present at a surface of the polar semiconductor or at an interface of two different polar semiconductors. These fixed polarized charges may attract movable electrons or hole carriers, thus forming a two-dimensional electron gas 2DEG or a two-dimensional hole gas 2DHG. The generation of the two-dimensional electron gas 2DEG or two-dimensional hole gas 2DHG does not require an additional electric field, nor does it depend on a doping effect in the semiconductor. They are spontaneously generated. The two-dimensional electron gas or two-dimensional hole gas at the interface of the polar semiconductors may have a high surface charge density. At the same time, since doping is not required, ion scattering and other effects that the two-dimensional electron gas or the two-dimensional hole gas is subjected to are greatly reduced, and thus the mobility is high. The higher surface charge density and mobility enable the two-dimensional electron gas or hole gas spontaneously generated at such interface to have good conductivity and very high response speed. In combination with advantages such as high breakdown electric field inherent to the nitride semiconductor itself, such two-dimensional electron gas or two-dimensional hole gas may be used to fabricate a high electron mobility transistor (HEMT) or a high hole mobility transistor (HHMT), the performances of which in high energy, high voltage or high frequency applications are significantly better than those made of traditional Si or GaAs devices. However, existing structures have many defects, which seriously restrict application ranges thereof.

SUMMARY OF THE DISCLOSURE

In view of the problems in the related art, a semiconductor device is proposed by the present disclosure, which includes: a substrate having a vertical interface; a channel layer disposed outside the vertical interface; and a channel supply layer disposed outside the channel layer; wherein at least one of a vertical two-dimensional electron gas 2DEG and a vertical two-dimensional hole gas 2DHG is formed in the channel layer adjacent to an interface between the channel layer and the channel supply layer.

The semiconductor device as described in the above, wherein the vertical interface includes a crystalline lattice of a hexagonal symmetry.

The semiconductor device as described in the above, wherein the substrate is a Si substrate, and the vertical interface is a (111) plane of Si.

The semiconductor device as described in the above, wherein the substrate is an Al2O3 sapphire substrate, and the vertical interface is a (0001) plane of Al2O3.

The semiconductor device as described in the above, wherein the substrate is a SiC substrate, and the vertical interface is a (0001) plane or a (000-1) plane of SiC.

The semiconductor device as described in the above, wherein the substrate is a GaN intrinsic substrate, and the vertical interface is a (0001) plane or a (000-1) plane of GaN.

The semiconductor device as described in the above, wherein the channel layer includes a polar face at a portion of the interface between the channel layer and the channel supply layer, and the two-dimensional electron gas 2DEG is adjacent to the first polar face.

The semiconductor device as described in the above, wherein the channel layer includes a polar face at a portion of the interface between the channel layer and the channel supply layer, and the two-dimensional hole gas 2DHG is adjacent to the second polar face.

The semiconductor device as described in the above, wherein the channel layer includes a first polar face at a first portion of the interface between the channel layer and the channel supply layer and a second polar face at a second portion of the interface between the channel layer and the channel supply layer, the two-dimensional electron gas 2DEG is adjacent to the first polar face, and the two-dimensional hole gas 2DHG is adjacent to the second polar face.

The semiconductor device as described in the above, further comprising a buffer layer between the substrate and the channel layer.

The semiconductor device as described in the above, wherein a height of the buffer layer is higher than a height of the substrate in a vertical direction.

The semiconductor device as described in the above, further comprising a nucleation layer on the vertical interface of the substrate.

The semiconductor device as described in the above, further comprising a nucleation layer and a buffer layer, wherein the nucleation layer is located on the vertical interface of the substrate, and the buffer layer is located between the nucleation layer and the channel layer.

The semiconductor device as described in the above, wherein a height of the channel layer is higher than a height of the substrate in a vertical direction.

The semiconductor device as described in the above, wherein one or more electrodes are formed on the channel supply layer adjacent to the 2DEG region.

The semiconductor device, wherein one or more electrodes are formed on the channel supply layer adjacent to the 2DHG region.

The semiconductor device as described in the above, further comprising a insulating layer is located between the substrate and the channel layer as well as between the substrate and the channel supply layer.

According to another aspect of the present disclosure, a method of fabricating a semiconductor device is proposed, which includes the steps of: forming a vertical interface on a substrate; forming a semiconductor channel layer outside the vertical interface; and forming a semiconductor channel supply layer outside the channel layer; wherein a vertical two-dimensional electron gas 2DEG or two-dimensional hole gas 2DHG is formed in the semiconductor channel layer adjacent to an interface between the semiconductor channel layer and the semiconductor channel supply layer.

The method as described in the above, further comprising forming insulating layers on the substrate.

The method as described in the above, further comprising forming a buffer layer outside the vertical interface.

The method as described in the above, further comprising forming a nucleation layer on the vertical interface.

In another aspect of the present disclosure, a semiconductor device is proposed, which comprises: a column having a sidewall surface; and one or more electrodes disposed on the side wall surface of the column; wherein the column includes at least one of a two-dimensional electron gas 2DEG region and a two-dimensional hole gas 2DHG region adjacent to the sidewall surface.

The semiconductor device as described in the above, wherein the column includes a first sidewall surface and a second sidewall surface, wherein the two-dimensional electron gas 2DEG is adjacent to the first sidewall surface and the two-dimensional hole gas 2DHG is adjacent to the second sidewall surface.

The semiconductor device as described in the above, wherein the column comprises: a channel layer; and a channel supply layer at least partially overlaying a sidewall surface of the channel layer.

The semiconductor device as described in the above, further comprising a substrate having a vertical interface, wherein the column is formed overlaying the vertical interface of the substrate.

The semiconductor device as described in the above, wherein the sidewall surface of the column includes at least one of a (0001) polar face and a (000-1) polar face of a III-V compound semiconductor.

BRIEF DESCRIPTION OF THE DRAWINGS

Hereinafter, preferred embodiments of the present disclosure will be further described in detail with reference to the accompanying drawings, in which.

DETAILED DESCRIPTION OF THE EMBODIMENT(S) OF THE DISCLOSURE

Figure 1:
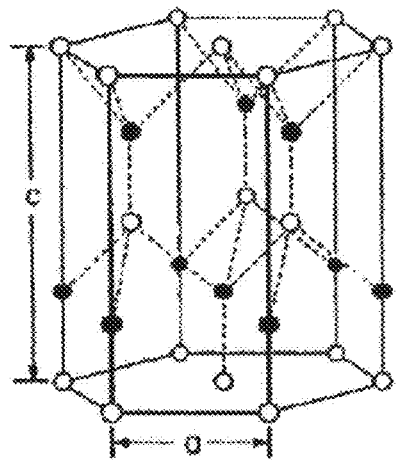
FIG. 1 is a schematic view of a group III nitride semiconductor of a wurtzite structure.

In order that the objects, technical solutions and advantages of the embodiments of the present disclosure will become clearer, technical solutions in the embodiments of the present disclosure will be described clearly and completely below in conjunction with the drawings in the embodiments of the present disclosure. Apparently, the described embodiments are some of the embodiments of the present disclosure, not all of them. All the other embodiments obtained by those skilled in the art based on the embodiments of the present disclosure without creative efforts will fall within the scope of the present disclosure.

In the following detailed description, reference may be made to various drawings which constitute a part of the present application and serve to explain the present application. In the drawings, similar reference signs denote substantially similar components in different figures. The individual specific embodiments of the present application will be described in sufficient detail below to enable those of ordinary knowledge and skills in the art to carry out the technical solutions of the present application. It is understood that other embodiments may be utilized, or structural, logical or electrical changes may be made to the embodiments of the present application.

Group III nitride semiconductors generally have two crystal structures, i.e. wurtzite and zinc-blende. Practically applied Group III nitride semiconductors generally have a wurtzite structure due to their advantages in terms of stability and ease of obtaining higher crystal quality. Hereinafter, the technical solution of the present disclosure will be described by taking a wurtzite structure as an example. The present disclosure may also be applied to a group III nitride semiconductor of a zinc-blende structure in case the same principle is applied.

FIG. 1 is a schematic view of a group III nitride semiconductor of a wurtzite structure, wherein black dots represent Al, Ga and In, white dots represent N, and a and c are lattice constants, where a=0.318 nm, and c=0.516 nm. GaN or AlN of the Group III nitride semiconductor of the wurtzite structure has hexagonal symmetry on a (0001) plane (c plane). Since fabrication of bulk material of GaN and AlN is very expensive, GaN and AlN are typically epitaxially grown on a heterogeneous substrate and fabricated to a device. The most common substrate materials are $Al_2O_3$ (sapphire single crystal), silicon and SiC. A (0001) plane of $Al_2O_3$, a (0001) plane of 4H—SiC, and a (111) plane of silicon also have hexagonal symmetry, and therefore these planes are suitable for serving as substrate faces for heterogeneous growth, which are most advantageous for obtaining higher quality GaN or AlN crystals. That is, the GaN or AlN material grown on these faces of a heterogeneous substrate is typically in a (0001) or (000-1) orientation. For a Si substrate material, GaN is generally not able to be directly grown due to the influence of the Ga atom melt-back effect.

Typically, an AlN nucleation layer or the like is first grown on the Si substrate and then a GaN epitaxial layer is grown.

Figure 2:
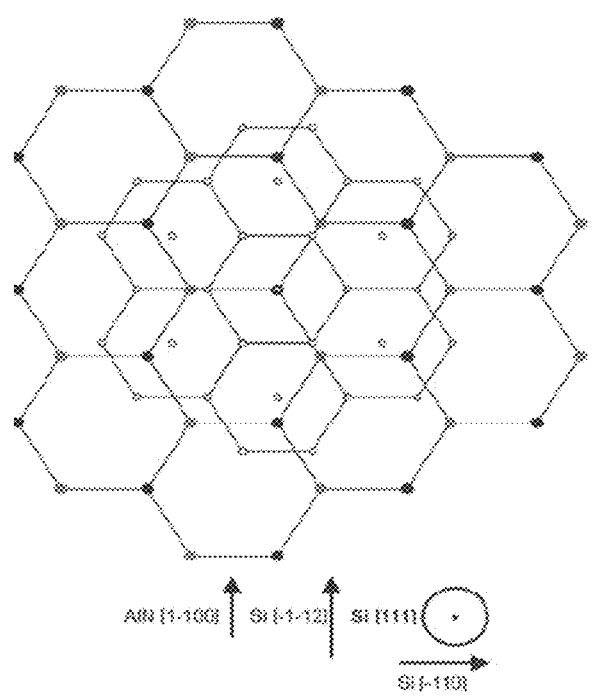
FIG. 2 is a schematic view showing an atomic correspondence of AlN growth on a Si (111) plane.

FIG. 2 is a schematic view showing an atomic correspondence of AlN growth on a Si (111) plane. As shown, dark or light black dots represent Si atoms, and white dots represent Al or N atoms. The Si (111) plane has a hexagonal symmetry structure, and the AlN (0001) plane thereon also has a hexagonal symmetry structure. Due to the symmetry of the crystal lattices, a good structural transition is formed by surface reconstruction of the Si substrate and the AlN nucleation layer.

Figures 3A, 3B:
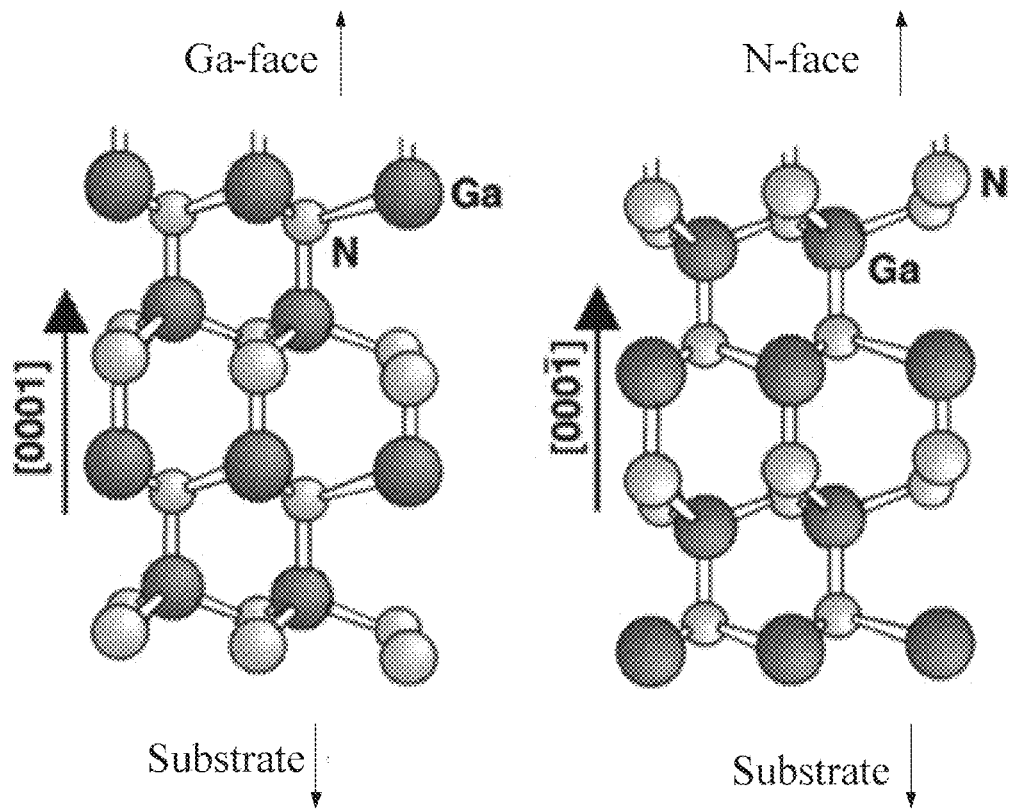
FIGS. 3A and 3B show a lattice structure of GaN.

FIGS. 3A and 3B show a lattice structure of GaN. As shown, GaN is an anisotropic material. Due to the lack of reverse symmetry, the (0001) plane of GaN is a polar face, the plane perpendicular to the (0001) plane is a non-polar face, and other planes are semi-polar faces. In particular, the correspondence between the (0001) plane and the (000-1) plane is the opposite direction of [0001], i.e., [000-1].

Due to the existence of spontaneous polarization and piezoelectric polarization effect, there are strong polarized positive charges at an interface between GaN and AlGaN on the (0001) plane and strong polarized negative charges at an interface between GaN and AlGaN on the corresponding (000-1) plane. These polarized positive and negative charges will attract electrons and holes, which produces a two-dimensional electron gas and a two-dimensional hole gas at the interfaces, respectively. These two-dimensional electron or hole gases are usually not present on the non-polar face, so the conductivity is generally low. The property of the semi-polar face is between that of the polar face and that of the non-polar face. Therefore, the polar face of GaN is the most desirable region for forming the two-dimensional electron gas or hole gas.

Figure 4A:
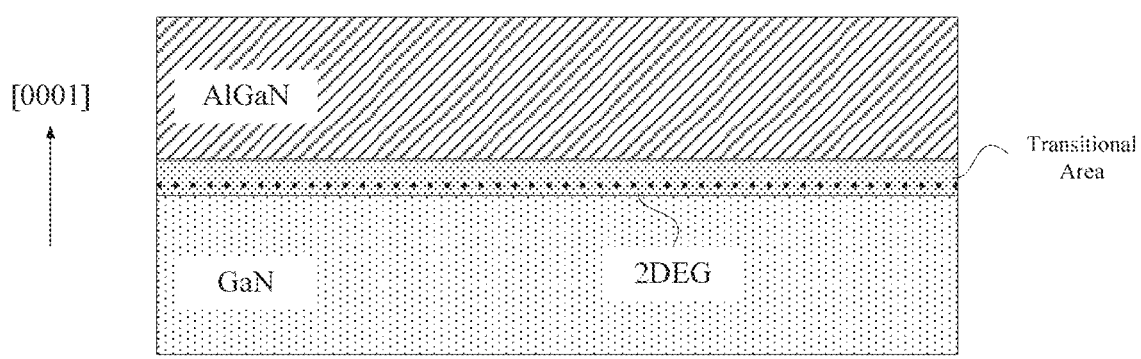
FIGS. 4A and 4B are schematic views showing a structure of forming a two-dimensional electron gas or two-dimensional hole gas.
Figure 4B:
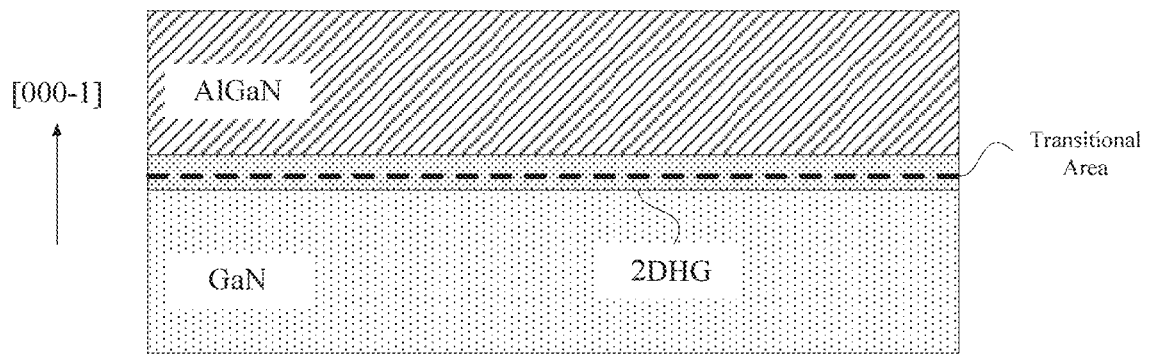

FIGS. 4A and 4B are schematic views showing a structure of forming a two-dimensional electron gas or two-dimensional hole gas. As shown in the figures, if GaN is in contact with AlGaN in the direction of (0001), a transition region between GaN and AlGaN will form a two-dimensional electron gas 2DEG having a very high carrier concentration and a very high carrier mobility. If the GaN is in contact with AlGaN in the direction of (000-1), the transition region between GaN and AlGaN will form a two-dimensional hole gas 2DHG having a very high carrier concentration and a very high carrier mobility. The two-dimensional electron gas 2DEG or two-dimensional hole gas 2DHG is the core component for the fabrication of high electron mobility transistor (HEMT) and high hole mobility transistor (HHMT).

Figure 5:
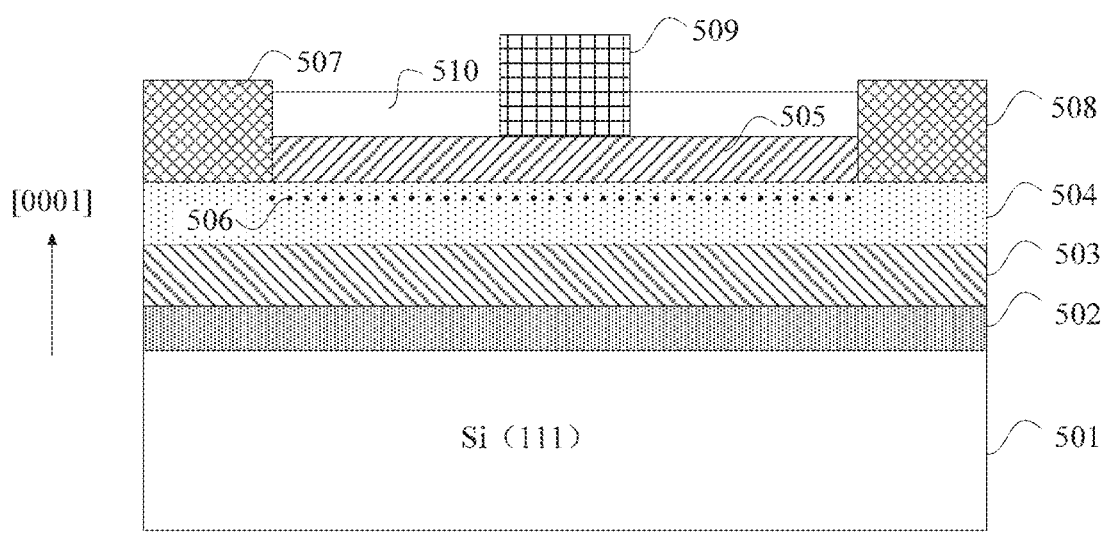
FIG. 5 is a schematic structural view of an existing HEMT transistor with a Si substrate.

FIG. 5 is a schematic structural view of an example HEMT transistor with a Si substrate. FIG. 5 is merely illustrative of the structure of a HEMT transistor. As is known to those skilled in the art, HEMT transistors may also be formed on other types of substrates, such as $Al_2O_3$ (sapphire), SiC, GaN, or even Direct-Bonded Copper (DBC). As described above, a transistor structure is formed on the (111) plane of the Si substrate, and the direction indicated by the arrow in the figure is the (111) plane of the Si substrate, that is, the (0001) plane of GaN.

As shown, a HEMT transistor 500 includes a nucleation layer 502 formed on a Si substrate 501, a buffer layer 503, a channel layer 504, and a channel supply layer 505. The nucleation layer 502 is typically AlN. The buffer layer 503 can continue to grow on the nucleation layer 502. The buffer layer 503 can reduce the difference in lattice constant and thermal expansion coefficient between the substrate 501 and the channel layer 504, and avoid occurrence of cracks or the like in the nitride epitaxial layer. The buffer layer 503 may have a single-layer structure or a multi-layer structure, including one or more of AlN, GaN, AlGaN, InGaN, AlInN and AlGaInN.

The channel layer 504 and the channel supply layer 505 may be disposed on the buffer layer 503. The channel layer 504 and the channel supply layer 505 are different semiconductor layers. A 2-dimensional electron gas (2DEG) 506 is formed in a region on the side of the channel layer 504 adjacent to the interface between the channel layer 504 and the channel supply layer 505. The channel layer 504 and the channel supply layer 505 include semiconductor materials having different polarization characteristics and/or energy band gaps and/or lattice constants. For example, the channel supply layer 505 may include a material (semiconductor) having a higher polarization and/or a wider band gap than the channel layer 504. One example of the channel supply layer is a barrier layer.

In some embodiments, the channel layer 504 includes a group III-V based compound semiconductor. For example, the channel layer 504 may include a GaN-based material (e.g., GaN). By way of example, the channel layer 504 may be an undoped GaN layer or a GaN layer doped with one or more impurities.

In some embodiments, the channel supply layer 505 may have a single-layer structure or a multi-layer structure, including one or more of AlGaN, AlInN, InGaN, AlN, AlInGaN and the like. The channel supply layer 505 may be an undoped layer, or may be a semiconductor layer doped with one or more impurities. For example, the channel supply layer 505 may be doped with a N-type impurity. A thickness of the channel supply layer 505 may be several tens of nanometers (nm) or less. For example, the channel supply layer 505 may have a thickness of about 50 nm or less.

As shown, the HEMT transistor 500 further includes a source structure 507, e.g., including a source electrode, a drain structure 508, e.g., including a drain electrode, and a gate structure 509, e.g., including a gate electrode. The source structure 507 and the drain structure 508 may be disposed on the channel supply layer 505 and on both sides of the gate structure 509, respectively. In some embodiments, the source structure 507 and the drain structure 508 may be formed on the channel supply layer 505. The source structure 507 and the drain structure 508 are electrically connected to the 2DEG 506. In some embodiments, an ohmic contact layer (not shown) may be further disposed between the source structure 507 and the channel supply layer 505 as well as between the drain structure 508 and the channel supply layer 505, thereby providing an ohmic contact between the source structure 507 and the channel supply layer 505 as well as between the drain structure 508 and the channel supply layer 505. The gate structure 509 may be disposed on the channel supply layer 505. The gate structure 509 may include a gate electrode formed of various metals or metal compounds and a gate dielectric layer.

As shown, the HEMT transistor 500 includes a passivation layer 510. The passivation layer 510 may be disposed on the channel supply layer 505 and covers a region other than the source structure 507, the drain structure 508 and the gate structure 509. The passivation layer 510 separates the gate structure 509 from the source structure 507 and the drain structure 508. The passivation layer 510 may be formed of at least one insulating material such as silicon oxide, silicon oxynitride or silicon nitride, and may have a single-layer structure or a multi-layer structure.

As is known to those skilled in the art, the above description is merely illustrative of the structure of a HEMT transistor. The HEMT transistors also have a variety of other structures or modifications, alterations or variations to these structures to provide different properties or functions. These structures and their modifications, alterations or modifications may also be applied to the solution of the present disclosure within the technical idea of the present disclosure.

In some embodiments, the present disclosure includes a semiconductor device having a vertical channel structure. In some embodiments of the present disclosure, such a semiconductor device may be a high mobility transistor, a HEMT, a HHMT, and a heterogeneous integration thereof. Such a semiconductor device may also be another device such as a Schottky diode or the like.

Figure 6:
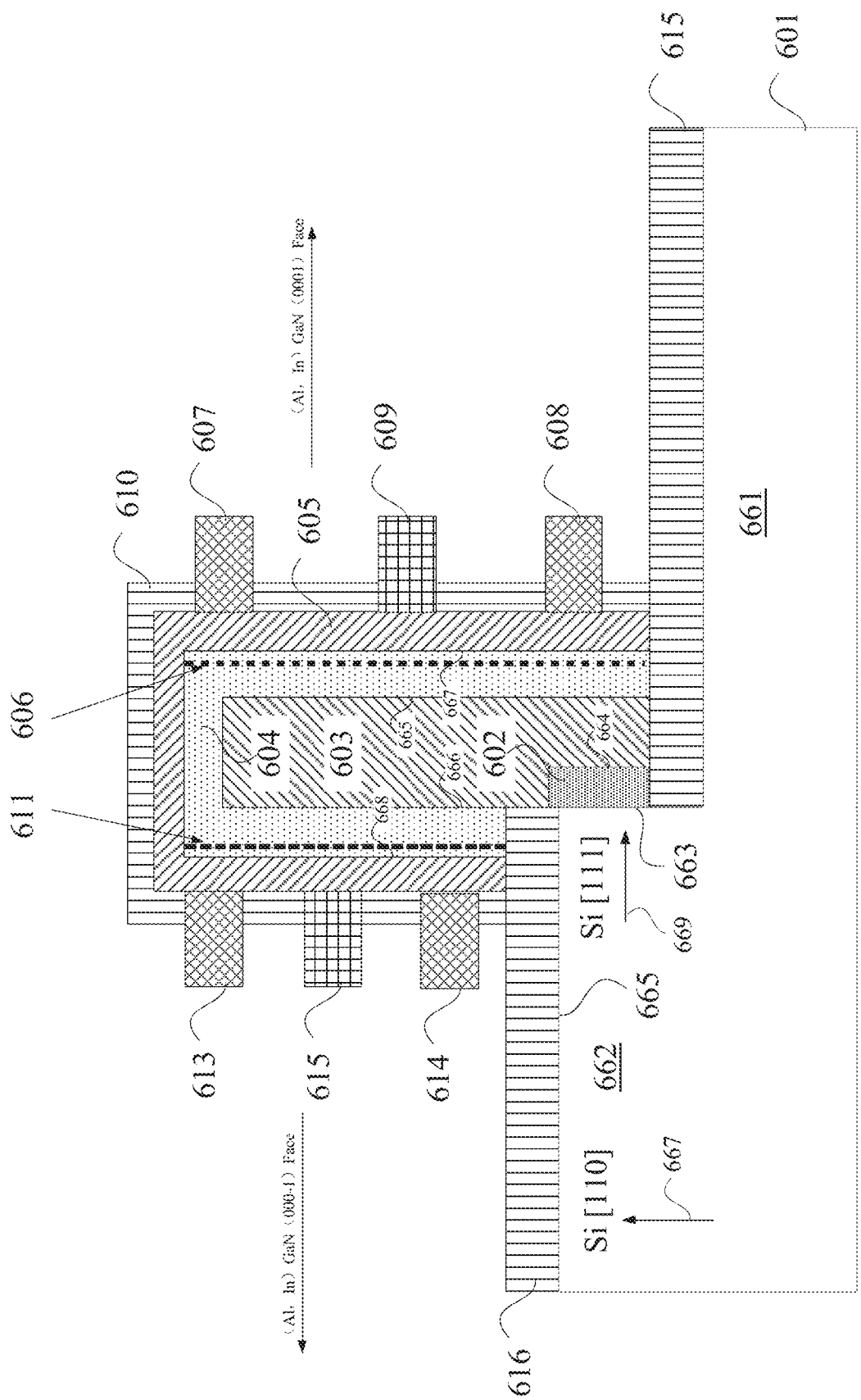
FIG. 6 is a schematic structural view of a semiconductor device according to an embodiment of the present disclosure.

FIG. 6 is a schematic structural view of a semiconductor device according to an embodiment of the present disclosure. As shown, the semiconductor device 600 includes a substrate 601. The substrate 601 includes a first region 661 and a second region 662. The first region 661 and the second region 662 have different heights, thereby forming a vertical interface 663 between the first region 661 and the second region 662, like a stepped substrate structure. The semiconductor device 600 may also include insulating layers 615 and 616 covering the first region 661 and second region 662 of the substrate 601.

According to an embodiment of the present disclosure, the vertical interface 663 has a hexagonally symmetrical lattice structure, such as a (0001) plane of $Al_2O_3$, a (0001) plane of 4H—SiC, and a (111) plane of Si. Taking a Si substrate as an example, unlike a lattice direction of a typical Si substrate, the horizontal interface 665 in the vertical direction shown by the vertical arrow 665 in the figure is the Si (110) plane, and the vertical interface 663 in the horizontal direction shown by the horizontal arrow 669 in the figure is Si (111) plane. The above description is merely illustrative of the structure of the semiconductor device of the present disclosure formed on a Si substrate. As is known to those skilled in the art, similar structures may be formed on other types of substrates, such as $Al_2O_3$ (sapphire), SiC, GaN, or even Direct-Bonded Copper (DBC).

Although the growth face of the Group III nitride in all of the figures is shown as in the (0001) orientation, such an orientation is not necessary, and, e.g., a (000-1) orientation is also possible under certain process conditions.

For the Si material, due to its reverse symmetry, there is no difference in properties between the (111) plane and the (-1-1-1) plane of Si. Materials such as AlN grown on the (111) plane of silicon and subsequent GaN are generally gallium-polar, that is, the growth face thereof is the (0001) plane. Although it is difficult to obtain high quality nitrogen-polar crystals, it is also feasible.

For $Al_2O_3$, also due to its reverse symmetry, there is no difference in properties between the (0001) plane and the (000-1) plane of $Al_2O_3$. Materials such as AlN grown on the (0001) plane of sapphire and subsequent GaN are generally gallium-polar, that is, the growth face thereof is the (0001) plane. Suitable nitrogen-polar crystals may also be grown under suitable process conditions. That is to say, if the growth face thereof is the (000-1) plane, a higher crystal quality can also be obtained.

For the 4H—SiC substrate, since it has no reverse symmetry, there is a difference in properties between the (0001) plane and the (000-1) plane. High quality crystals generally cannot be obtained on the (000-1) plane. At the same time, good gallium-polar crystals can be obtained using the (0001) growth face; however, high-quality nitrogen-polar crystals generally also cannot be obtained.

The semiconductor device 600 further includes a nucleation layer 602, a buffer layer 603, a channel layer 604 and a channel supply layer 605. The nucleation layer 602 is grown at the vertical interface 663, and the buffer layer 603 is grown on the nucleation layer 602 and envelops the nucleation layer 602. The channel layer 604 is formed over the buffer layer 603 and envelops the buffer layer 603. The channel supply layer 605 is formed over the channel layer 604 and envelops the channel layer 604. Parts similar to those in FIG. 5 are not described herein again.

In some embodiments in which other substrates than the Si substrate are used, the nucleation layer 602 is not necessary. Crystals can be grown directly on the vertical interface 663 of the substrates of some other materials, e.g., 4H—SiC or $Al_2O_3$. For example, crystals such as GaN can be directly grown on a (0001) plane of $Al_2O_3$ (sapphire) or a (0001) plane of 4H—SiC. In some embodiments, the buffer layer 603 is not necessary. Since the vertical interface 663 has a relatively small area, the degree of influence of the lattice mismatch is lower than that of the structure shown in FIG. 5, so the channel layer 604 can be directly grown without using the buffer layer 603.

In some embodiments, when the buffer layer 603, the channel layer 604, or the channel supply layer 605 is grown, the buffer layer 603, the channel layer 604, or the channel supply layer 605 may have a height higher than that of the second region 662 of the Si substrate 601, thereby forming a column structure. For example, the column may include the buffer layer 603, the channel layer 604, and the channel supply layer 605. As another example, the column may include the channel layer 604 and the channel supply layer 605 without including the buffer layer 603. The column structure allows the interface between the channel layer 604 and the channel supply layer 605 to have a larger area, thereby providing better device performance and forming a more complicated structure.

In some embodiments, when the buffer layer 603, the channel layer 604, or the channel supply layer 605 is grown, the buffer layer 603, the channel layer 604, or the channel supply layer 605 may have a height not higher than that of the second region 662 of the Si substrate 601. For example, by covering a portion of the vertical interface 663 by the passivation layer, the buffer layer 603, the channel layer 604, or the channel supply layer 605 is formed only on the remaining portions of the vertical interface 663.

In some embodiments, the nucleation layer 602, the buffer layer 603, the channel layer 604, or the channel supply layer 605 may not be in an enveloped positional relationship. For example, a portion of the surface of the nucleation layer 602, the buffer layer 603, or the channel layer 604 may be covered by a protective layer, and the buffer layer 603, the channel layer 604, or the channel supply layer 605 may be formed only on the remaining surfaces of the underlying layers. Alternatively, after the growth of the buffer layer 603, the channel layer 604, or the channel supply layer 605, a portion of the buffer layer 603, the channel layer 604, or the channel supply layer 605 is removed. Therefore, the nucleation layer 602, the buffer layer 603, the channel layer 604, or the channel supply layer 605 may also be in other positional relationships.

In some embodiments, the nucleation layer 602 is AlN. The buffer layer 603 is one or more of AlN, GaN, AlGaN, InGaN, AlInN and AlGaInN. The channel layer 604 includes a group III-V based compound semiconductor, e.g., GaN, AlGaN, InGaN or AlGaInN. In the description herein, "(Al, In) GaN" is used to refer to a group III-V based compound semiconductor including mainly GaN and also some other III-V compound semiconductor like InN and/or AlN. In some embodiments, The channel supply layer 605 may include one or more of AlGaN, AlInN, InGaN, AlN, AlInGaN and the like.

In some embodiments, the structure of FIG. 6 is different from the structure of the embodiment shown in FIG. 5 in the lattice orientations of the crystals of respective layers. Since the vertical interface 663 of the Si substrate is a Si (111) plane, a vertical interface 664 of the AlN crystal of the nucleation layer 602 grown thereon is an AlN (0001) plane. Similarly, vertical interfaces 665 and 666 of the buffer layer 604 grown on the nucleation layer 602 are (000-1) and (0001) planes of, e.g., AlGaN or GaN, respectively. Further, vertical interfaces 667 and 668 of the channel layer 604 are also (000-1) and (0001) planes of, e.g., GaN, AlGaN, InGaN or AlGaInN. That is, the horizontal leftward arrow in the figure indicates the (000-1) plane of the (Al, In) GaN crystal, whereas the horizontal rightward arrow in the figure indicates the (0001) plane of the (Al, In) GaN crystal.

It will also be understood by those skilled in the art that, similar to the crystal orientation of FIG. 5, the upward orientation of the crystal in FIG. 5 becomes the rightward orientation of the crystal in FIG. 6. Of course, since the channel layer 604 and the channel supply layer 605 exceed the height of the Si substrate 601, a left-side interface which is not present in the structure of FIG. 5 is added to the semiconductor device 600. The orientation of each crystal on the left-side interface actually corresponds to the orientation of each crystal on a right-side interface.

Since the two-dimensional electron gas 2DEG or two-dimensional hole gas 2DHG is usually not present on the non-polar face, the conductivity is generally low. The property of the semi-polar face is between that of the polar face and that of the non-polar face. Therefore, if it is required to obtain 2DEG or 2DHG, it is most desirable to form them on the polar face. In the structure shown in FIG. 6, the polar interfaces of the channel layer 604 are the (000-1) and (0001) planes. 2DEG or 2DHG may be provided adjacent to the interface of the channel layer 604 and the channel supply layer 605 in the channel layer 604; wherein a region of the polar face (0001) of the channel layer 604 that is adjacent to the channel supply layer 605 is 2DEG 606, and a region of the polar face (000-1) of the channel layer 604 that is adjacent to the channel supply layer 605 is 2DHG 611. Thus, an integrated 2DEG or 2DHG is provided in the semiconductor device 600.

In some embodiments, the channel layer 504 and the channel supply layer 605 on the vertical face are both polar compound semiconductors. The channel supply layer 605 has a wider band gap than the channel layer 604. There is fixed polarized charges between the channel layer and the barrier layer, and these fixed polarized charges attract electron and holes, and cause the formation of a two-dimensional electron gas 2DEG 606 and a two-dimensional hole gas 2DHG 611 at the interfaces. Alternatively, most fundamentally, a two-dimensional electron gas 2DEG or a two-dimensional hole gas 2DHG is spontaneously generated at the interface between the channel layer and the channel supply layer without an applied electric field or other conditions.

As shown in FIG. 6, further, the semiconductor device 600 includes, on a side of the channel supply layer 605 that is close to the 2DEG 606, a source structure 607, a drain structure 608, and a gate structure 609. Therefore, a high mobility transistor HEMT is formed on the 2DEG side of the semiconductor device 600. The semiconductor device 600 includes a source structure 613, a drain structure 614, and a gate structure 615 on a side of the channel supply layer 605 that is close to the 2DHG 611. Therefore, a high mobility transistor HHMT is formed on the 2DHG side of the semiconductor device 600. Thus, an integrated HEMT or HHMT is provided in the semiconductor device 600. Further, the semiconductor device 600 may include a passivation layer 610 covering the channel supply layer 605 to protect the structure inside it.

In the present embodiment, the two-dimensional electron gas 2DEG or the two-dimensional hole gas 2DHG is formed in the vertical direction to form a column structure having a vertical channel. This structure has many excellent characteristics which are not possessed by the structure of the horizontal channel of FIG. 5. For example, by increasing the thickness of the vertical channel, a conductive area of the device can be increased without being limited by the area of the substrate any longer. At the same time, a contact area of the vertical-channel device and the substrate is relatively small, and the influence of the substrate is relatively small, so it is relatively easier to overcome the problem that the conventional planar device is prone to epitaxial layer cracking. Moreover, the conventional planar structure enables only the formation of a high quality [0001] oriented nitride epitaxial layer, which is not advantageous for forming the 2DHG and limits an application range thereof.

Figure 7A:
FIGS. 7A-7H are flow charts of a method of fabricating a semiconductor device according to an embodiment of the present disclosure.

FIGS. 7A-7H are flow charts of a method of fabricating a semiconductor device according to an embodiment of the present disclosure. As shown in FIG. 7, the method of fabricating a semiconductor device includes a step 710 of forming a vertical interface on a substrate as shown in FIG. 7A. In a basic structure similar to that depicted in FIG. 6, the group III nitride epitaxial layer is obtained by epitaxial growth. Before the epitaxial growth, a desired substrate structure needs to be formed by etching. There are many ways to obtain such a substrate structure, and the method illustrated in this embodiment is only one of them.

In the present embodiment, a device fabricated on the (111) plane of a Si substrate is taken as an example, that is, the vertical interface is the Si (111) plane. Other substrates such as $Al_2O_3$ (sapphire), SiC, etc., as long as a plane having hexagonal symmetry can be obtained in a surface perpendicular to the substrate (such as an $Al_2O_3$ (sapphire) (0001) plane, a 4H—SiC (0001) plane and the like), can realize a device of the same structure.

For the Si substrate, at least the substrates of the (110) and (112) planes can obtain a plane having hexagonal symmetry in the vertical direction, that is, Si (111) in a general sense. Since Si has reverse symmetry, the Si (111) plane is the same as the (-1-1-1) plane. In practice, there may also be other equivalent planes. FIG. 7I is a schematic view of a crystal plane perpendicular to the (111) plane of the Si substrate. As can be seen from the geometric relationship between the Si (111) plane and other planes shown in FIG. 7I, the (111) plane can be formed in the vertical direction in both the (110) and (112) planes. Those skilled in the art will appreciate that there are also other crystal planes that have a perpendicular relationship to the (111) plane. The Si substrate formed in these manners may have a Si (111) plane obtained at the vertical interface after etching, and these manners are also within the scope of the present disclosure.

The (0001) plane of $Al_2O_3$ (sapphire) also has hexagonal symmetry, and is a commonly used growth face of GaN materials, which enables a high GaN crystal quality to be obtained. Commonly seen planes that are perpendicular to the (0001) plane include m-plane (1-100), a-plane (11-20), and the like. Therefore, a (0001) plane in the vertical direction can be obtained on the substrate having these surfaces, and it becomes a growth face of the GaN-based epitaxial layer. FIG. 7J shows a schematic view of a crystal structure of Al$_2$O$_3$ (sapphire).

SiC also has similar characteristics. SiC has many polytypes. Taking 4H—SiC which is commonly seen in power semiconductors as an example, FIG. 7K shows a crystal structure of 4H—SiC. The (0001) plane of 4H—SiC has hexagonal symmetry, and is a commonly used growth face of GaN materials, which enables a high GaN crystal quality to be obtained. Commonly seen planes that are perpendicular to the (0001) plane include m-plane (1-100), a-plane (11-20), and the like. Therefore, a (0001) plane in the vertical direction can be obtained on the substrate having these surfaces, and it becomes a growth face of the GaN-based epitaxial layer.

In some embodiments of the present disclosure, the (111) plane in the vertical direction can be obtained by anisotropic etching or the like on the Si substrate 701 in the (110) plane to form the structure shown in FIG. 7A. FIG. 7L shows different anisotropic etching manners and etchants used. Note that the vertical plane in the D direction is the (111) plane of Si.

Figure 7B:

Further, at step 720, as shown in FIG. 7B, a protective layer is formed at the vertical interface. In some embodiments, the protective layer can be formed over the entire substrate by crystal growth, and then the protective layer is removed by an etching technique having a vertical orientation, leaving only the protective layers 702 and 703 on the vertical interface. For example, SiN may be grown using a technique such as LPCVD to form a protective layer. After a vertically oriented etching, only the SiN on the sidewall is reserved. In some embodiments, a protective layer may be deposited on the substrate 701 by deposition, then a mask layer is formed on the surface of the protective layer on the vertical interface, and a protective layer other than the mask layer is removed by the etching technique, leaving only the protective layers 702 and 703 on the vertical interface. Then, the mask layer on the protective layer is removed.

Figure 7C:
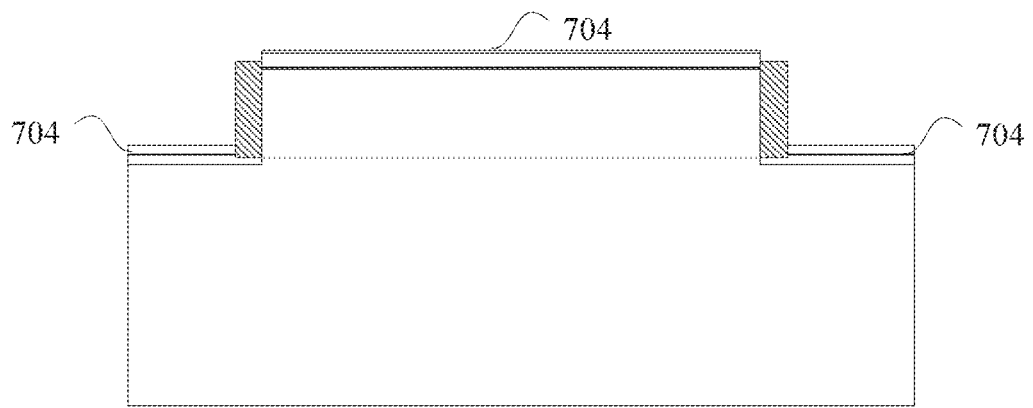

Further, at step 730, as shown in FIG. 7C, an insulating layer is formed on a region on the substrate other than the protective layers. In some embodiments, an insulating layer 704 may be formed over the entire substrate by crystal growth. For example, SiO$_2$ is grown by an oxidation technique. Since the vertical interface is protected by SiN, there is substantially no growth of SiO$_2$. In some embodiments, the insulating layer may be formed by deposition. For example, SiO$_2$ is deposited over the entire substrate, and then SiO$_2$ on the protective layers 702 and 703 is removed by the etching technique to expose the protective layers 702 and 703.

Figure 7D:
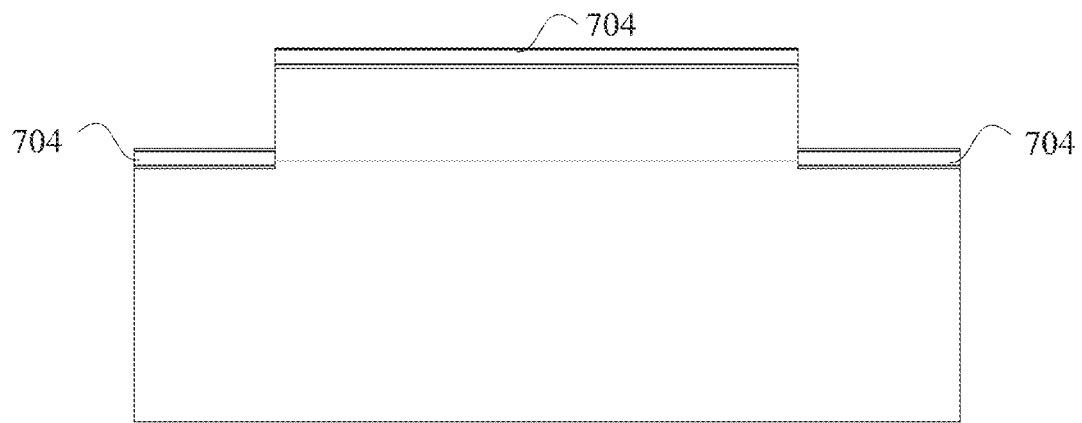

Further, at step 740, as shown in FIG. 7D, the protective layers are removed to expose the vertical interface of the substrate. In some embodiments, the protective layers may be removed by selective etching, while the insulating layer is reserved. For example, for the SiN protective layer, SiN is selectively etched by a substance such as hot phosphoric acid to expose the Si (111) plane of the vertical surface.

As will be appreciated by those skilled in the art, for other types of substrate materials, such as Al$_2$O$_3$ (sapphire), SiC, etc., GaN may be nucleated and grown directly on the (0001) plane of Al$_2$O$_3$ (sapphire) or the (0001) plane of SiC. Thus, for other types of substrate materials, an insulating layer may be formed directly on the substrate 701 at step 710 to expose the nucleation face of the vertical surface without introducing the processes of steps 720-740.

In some embodiments, for Al$_2$O$_3$ (sapphire) and SiC substrates, the insulating layer 704 may also not be necessary. Since Ga atoms are compatible with Al$_2$O$_3$ or SiC, there is no melt-back. Under suitable process conditions, it is easy to nucleate and grow on Al$_2$O$_3$ (0001) or SiC (0001) with hexagonal symmetry. Therefore, such a substrate having a vertical growth face naturally has the ability of selected-region growth. Of course, if an amorphous insulating layer such as SiO$_2$ or SiN is still used, process control can be made easier.

Figure 7E:
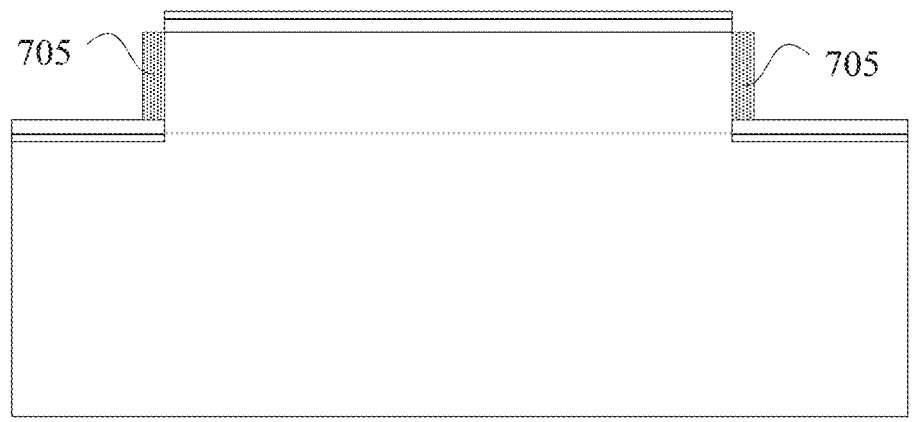

At step 750, as shown in FIG. 7E, a nucleation layer is formed on the vertical surface. For the Si substrate, a nucleation layer 705 (e.g., AlN) is employed due to the melt-back effect of Ga atoms. However, the ability of selected-region growth of AlN is weak, so there may also be some growth on the insulating layer 704, which has an adverse effect on the semiconductor device.

In some embodiments, a wafer can be taken out after the AlN is grown. Only the AlN nucleation layer on the vertical face is reserved by anisotropic etching, and the AlN in other places is removed, for example, by using dry etching of vertically downward ion bombardment. Since the ion bombardment on the AlN on the vertical face is weak and the ion bombardment on the AlN on other faces is strong, the object of reserving only the AlN on the vertical face can be achieved. In some other embodiments, since the Si (111) plane is more likely to cause nucleation of AlN than an insulating material such as amorphous SiO$_2$ or SiN, AlN may also be nucleated and grown only on the vertical (111) silicon face under suitable growth processes. This simplifies the fabricating process.

As is known to those skilled in the art, although crystal quality control is difficult, GaN may be grown directly on the (0001) plane of Al$_2$O$_3$ (sapphire) or the (0001) plane of SiC. Therefore, in some cases, step 750 may not be necessarily included to introduce the nucleation layer 705 of low temperature GaN or AlN for example.

Figure 7F:

At step 760, a buffer layer is formed on the nucleation layer as shown in FIG. 7F. A buffer layer 706 is formed by epitaxial growth on the nucleation layer 705. As described above, in the structure of the semiconductor device of the present disclosure, a buffer layer is not necessary. In essence, the properties of the buffer layer and the channel layer are very close, and they can even be formed of the same material. Alternatively, the basic structure is the nucleation layer/channel layer/channel supply layer, and a buffer layer may be provided between the channel supply layer and the nucleation layer.

Figure 7G:
Figure 7H:
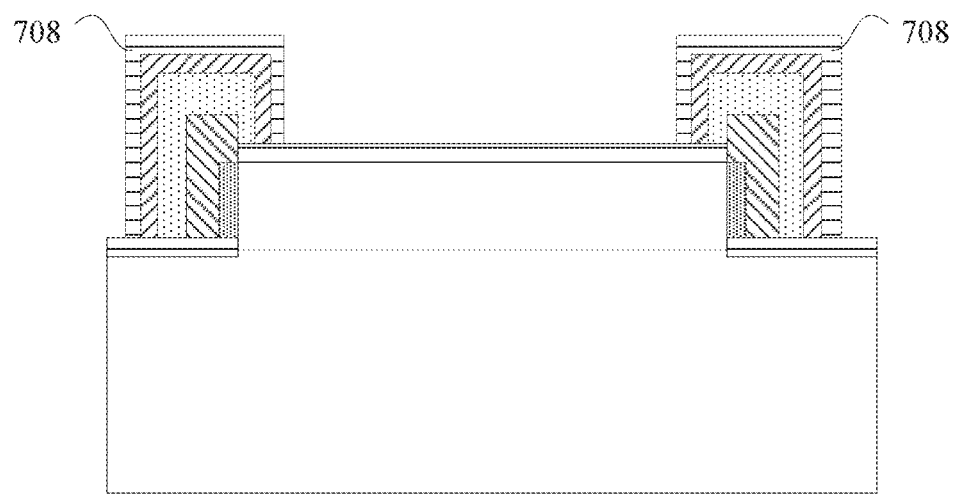
Figure 7I:
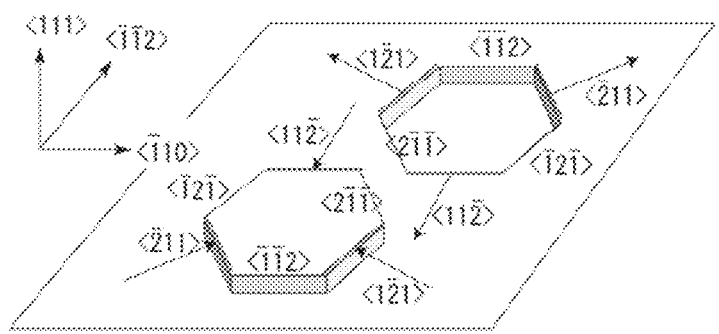
FIG. 7I is a schematic view showing a geometric relationship between a Si (111) plane and other planes.
Figure 7J:
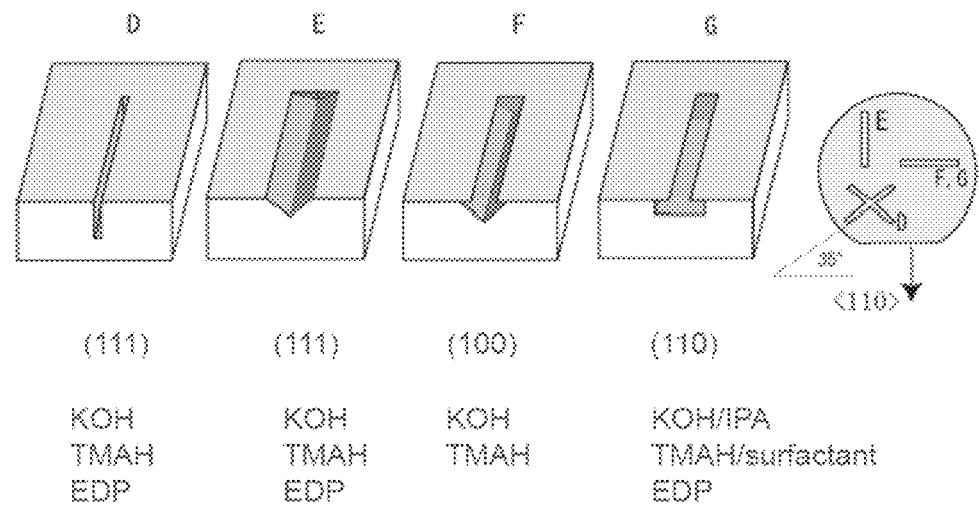
FIG. 7J is a schematic view showing a crystal structure of $Al_2O_3$ (sapphire)
Figure 7K:
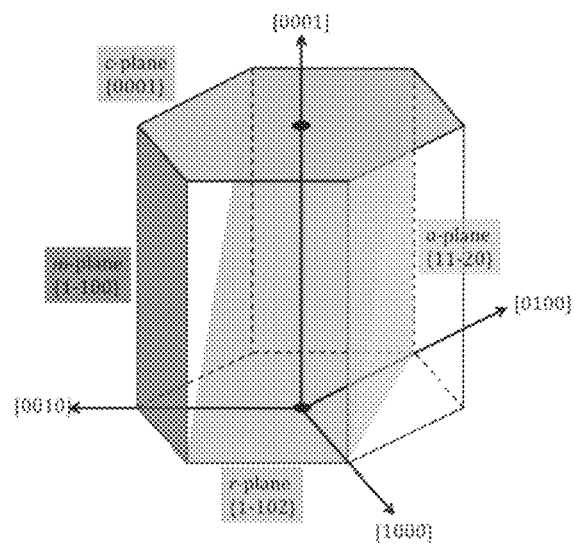
FIG. 7K is a schematic view showing a crystal structure of 4H—SiC.
Figure 7L:
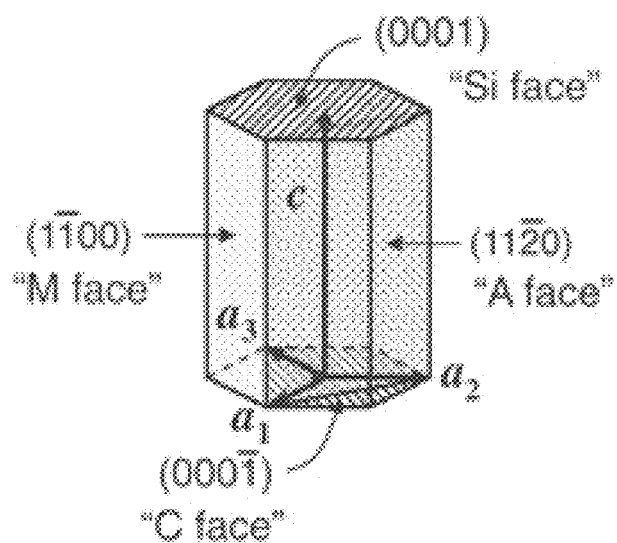
FIG. 7L is a schematic view showing different anisotropic etching modes.

At step 770, as shown in FIG. 7G, a channel layer is formed on the buffer layer. At step 780, as shown in FIG. 7H, a channel supply layer is formed on the channel layer. Fundamentally, the most critical step is to form a channel. The channel is created at the interface of a nitride semiconductor having a narrow forbidden band width/a nitride semiconductor having a wide forbidden band width. The most common example is the GaN/AlGaN interface. The channel can produce 2DEG or 2DHG. The channel is located in the channel layer having a smaller forbidden band width and adjacent to the interface of the channel layer/the channel supply layer. Carriers (electrons or holes) flow mainly in the channel and have a high mobility and charge density.

In some embodiments, the buffer layer, the channel layer, and the channel supply layer, or the channel layer and the channel supply layer, form a column structure. The columns have a higher height than the substrate 701, thereby providing a larger interface between the channel layer 604 and the channel supply layer 605, and providing better device performance, which is advantageous for the formation of a more complicated structure.

At step 790, an electrode and a passivation layer are formed on the channel supply layer. A source, a drain and a gate, as well as a passivation layer, may be further formed on the channel supply layer to form a structure similar to that shown in FIG. 6.

In some embodiments, the source and the drain form an ohmic contact with 2DEG or 2DHG to reduce contact resistance. In some embodiments, the gate is configured to minimize leakage current to the channel. For example, the gate may form a Schottky contact with the channel supply layer, or an insulating layer may be formed under the gate structure to reduce leakage current, that is, a gate insulating layer is first formed before the gate structure is formed.

In some embodiments, for both HEMT and HHMT devices, the same material may be used for both the source and the drain. However, since the ohmic contact metal of the HEMT and the ohmic contact metal of the HHMT are generally different, the source and drain material of the HEMT and the source and drain material of the HHMT are usually different. Since the requirements on the work function are usually different, the gate material of the HEMT and the gate material of the HHMT are also usually different.

In some embodiments, when a passivation layer is formed on the channel supply layer, it may be generated in-situ in the same growth apparatus after epitaxially growing the nitride semiconductor, or may be additionally generated after the wafer is taken out.

In some applications, it is advantageous to generate only HEMT or HHMT on one column. Especially when the operating voltage is high, there may be a large leakage current between the HEMT and the HHMT formed on the same column. At the same time, if the HEMT and the HHMT on the same column are close to each other, a large parasitic capacitance may exist between these devices, which will reduce the frequency response capability of the device.

In some embodiments of the present disclosure, only HEMT or HHMT is formed on one column.

Figure 8:
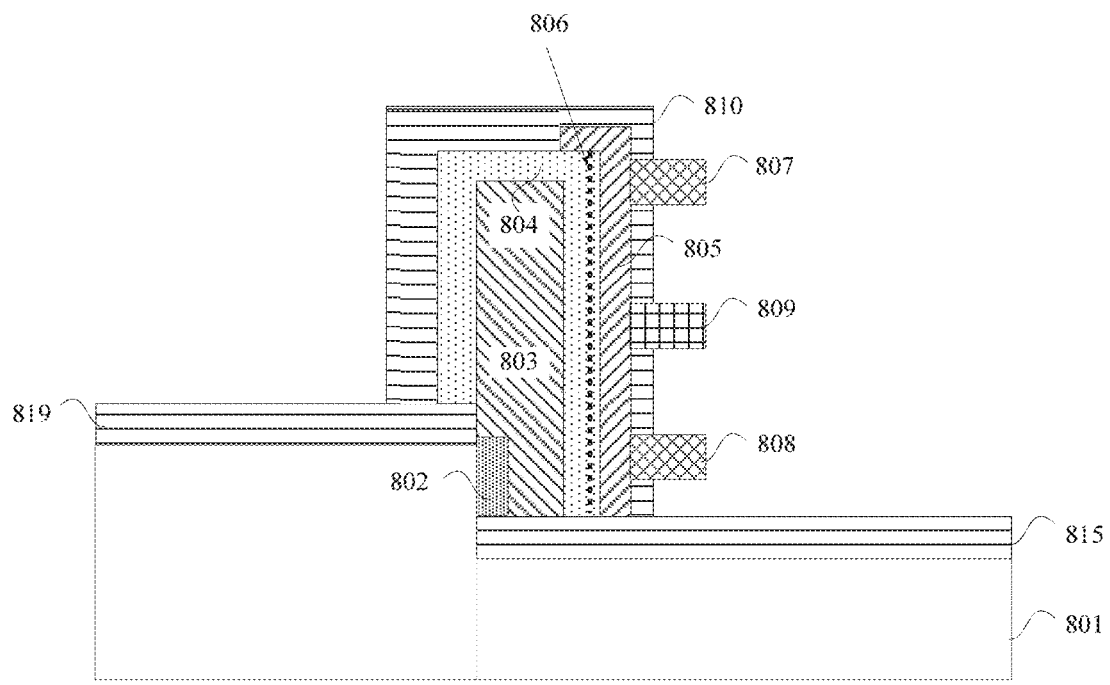
FIG. 8 is a schematic view of a semiconductor device in which only a HEMT is formed according to an embodiment of the present disclosure.

FIG. 8 is a schematic view of a semiconductor device in which only a HEMT is formed according to an embodiment of the present disclosure. As shown, the semiconductor device 800 includes a substrate 801. The substrate 801 includes a vertical interface. Insulating layers 815 and 819 are included on the substrate on both sides of the vertical interface. A nucleation layer 802, a buffer layer 803, a channel layer 804, and a channel supply layer 805 are formed on the vertical interface to form a column structure. A 2DEG 806 is formed in the channel layer 804 near the interface between the channel layer 804 and the channel supply layer 805. Further, a source 807, a drain 808 and a gate 809 are disposed on the channel supply layer 805. A passivation layer 810 is formed on regions of the entire column other than the source 807, the drain 808 and the gate 809. The same portions as those of the embodiment shown in FIG. 6 will not be described again.

As shown, the channel supply layer 805 is not disposed over the entire surface of the channel layer 804, but covers the (0001) polar face of the channel layer 804, and forms a 2DEG in the channel layer 804. In some embodiments, the channel supply layer 805 may or may not cover the non-polar face of the channel layer 804, such as covering the upper surface of the column, covering a portion of the upper surface of the column, or not covering the upper surface of the column. As shown, there is no channel supply layer on the (000-1) polar face of the channel layer 804, and thus there is no 2DHG. Only the HEMT transistor structure is formed on the column.

According to an embodiment of the present disclosure, the structure of the semiconductor device shown in FIG. 8 may be formed by the following method: depositing a first passivation layer to cover the entire column after growing the channel layer 804. The first passivation layer is etched to expose at least the channel layer 804 on the (0001) plane. A channel supply layer is then grown, and a second passivation layer is subsequently grown to cover the entire column, thus forming the structure shown in FIG. 8. Alternatively, the channel layer 804, the channel supply layer 805, and the first passivation layer are grown. Then, the first passivation layer on the (000-1) plane and the channel supply layer are etched, and then the second passivation layer is grown.

In some embodiments, since the channel supply layer is typically formed by growing AlGaN material having a poor growth selectivity, the first passivation layer may be covered with a thinner channel supply layer material. However, since the channel supply layer material has a good insulating ability, there is no significant influence on device performance. Of course, in some embodiments, the channel providing layer material covering the first passivation layer may also be removed by etching. Note that the first and second passivation layers are located in different regions on the device, but the materials may be completely the same. Therefore, the first and second passivation layers are not distinguished in FIG. 8.

Figure 9:
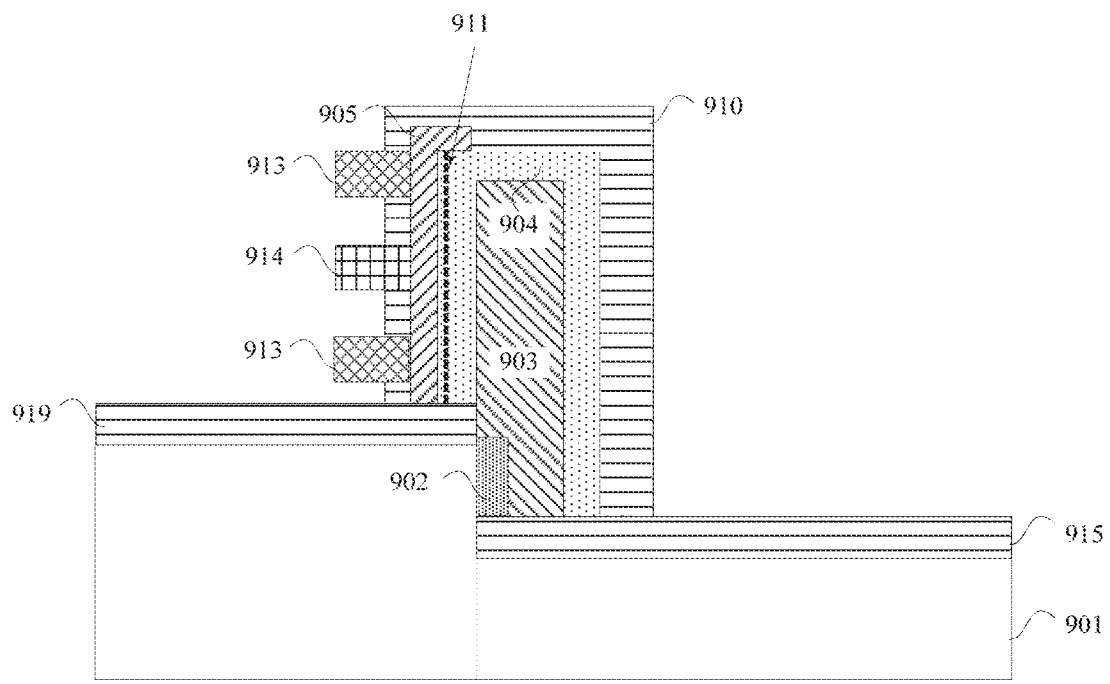
FIG. 9 is a schematic view of a semiconductor device in which only HHMT is formed according to an embodiment of the present disclosure.

FIG. 9 is a schematic view of a semiconductor device in which only HHMT is formed according to an embodiment of the present disclosure. As shown, the semiconductor device 900 includes a substrate 901. The substrate 901 includes a vertical interface. Insulating layers 915 and 919 are included on the substrate on both sides of the vertical interface. A nucleation layer 902, a buffer layer 903, a channel layer 904, and a channel supply layer 905 are formed on the vertical interface to form a column structure. A 2DEG 911 is formed in the channel layer 904 near the interface between the channel layer 904 and the channel supply layer 905. Further, a source 907, a drain 908 and a gate 909 are disposed on the channel supply layer 905. A passivation layer 910 is formed on regions of the entire column other than the source 907, the drain 908 and the gate 909. The same portions as those of the embodiment shown in FIG. 6 will not be described again.

As shown, the channel supply layer 905 is not disposed over the entire surface of the channel layer 904, but covers the (000-1) polar face of the channel layer 904, and forms a 2DHG in the channel layer 904. In some embodiments, the channel supply layer 905 may or may not cover the non-polar face of the channel layer 904, such as covering the upper surface of the column, covering a portion of the upper surface of the column, or not covering the upper surface of the column. As shown, there is no channel supply layer on the (0001) polar face of the channel layer 904, and thus there is no 2DEG. Only the HHMT transistor structure is formed on the column.

According to an embodiment of the present disclosure, the structure of the semiconductor device shown in FIG. 9 may be formed by the following method: depositing a first passivation layer to cover the entire column after growing the channel layer 904. The first passivation layer is etched to expose at least the channel layer 904 on the (000-1) plane. A channel supply layer 905 is then grown, and a second passivation layer is subsequently grown to cover the entire column, thus forming the structure shown in FIG. 9. Alternatively, the channel layer 904, the channel supply layer 905, and the first passivation layer are grown. Then, the first passivation layer on the (0001) plane and the channel supply layer are etched, and then the second passivation layer is grown.

In some embodiments, since the channel supply layer is typically formed by growing AlGaN material having a poor growth selectivity, the first passivation layer may be covered with a thinner channel supply layer material. However, since the channel supply layer material has a good insulating ability, there is no significant influence on device performance. Of course, in some embodiments, the channel supply layer material covering the first passivation layer may also be removed by etching. Note that the first and second passivation layers are located in different regions on the device, but the materials may be completely the same. Therefore, the first and second passivation layers are not distinguished in FIG. 9.

As will be appreciated by those skilled in the art, the relative arrangement of the source, the drain and the gate of HHMT and HEMT is for illustration only, and there may be many other relative positional relationships. The arrangement of the relative position of the HHMT and HEMT is also within the scope of the present disclosure.

As will be appreciated by those skilled in the art, the relative arrangement of the source, the drain and the gate in the above structure is for illustration only, and there may be many other relative positional relationships. For example, the source, the drain and the gate may be at the same height level; or two of the source, the drain and the gate are at the same height level; or the source, the drain and the gate may be at different heights; or the source, the drain and the gate are on the same vertical line; or two of the source, the drain and the gate are on the same vertical line; or the source, the drain and the gate are on different horizontal lines, or the arrangement of the source, the drain and the gate is a combination of the above.

Figure 10:
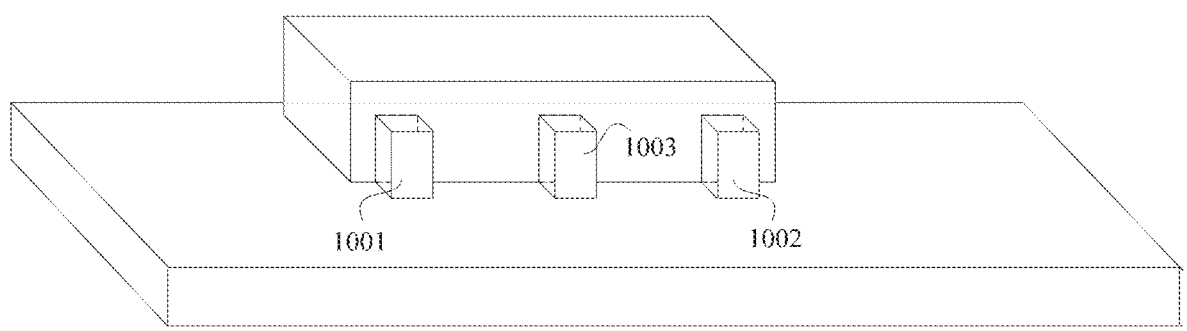
FIG. 10 is a schematic view of arrangements of a source, a drain and a gate of a high mobility transistor according to an embodiment of the present disclosure.

FIG. 10 is a schematic view of arrangements of a source, a drain and a gate of a high mobility transistor according to an embodiment of the present disclosure. As shown, a high mobility transistor is formed on a vertical interface 1010 of the semiconductor device on the substrate 1000. The high mobility transistor includes a source 1001, a drain 1002, and a gate 1003. As shown, the source 1001, the drain 1002, and the gate 1003 are at the same height level.

The above-described embodiments are merely illustrative of the present disclosure, and are not intended to limit the present disclosure. Various changes and modifications may also be made by those skilled in the art without departing from the scope of the present disclosure. Therefore, all the equivalent technical solutions should also fall within the scope of the present disclosure.

What is claimed is:

1. A semiconductor device, comprising:
 a semiconductor substrate having a vertical interface, wherein the substrate is a heterogeneous substrate;
 a channel layer disposed outside the vertical interface and laterally with respect to the vertical interface, wherein the channel layer is a GaN-based material;
 a channel supply layer disposed outside the channel layer; and
 a buffer layer epitaxially grown from a hexagonal symmetry surface between the substrate and the channel layer, the buffer layer laterally between the vertical interface and the channel layer;
 wherein at least one vertical two-dimensional carrier gas is formed in the channel layer adjacent to an interface between the channel layer and the channel supply layer;
 wherein a height of the buffer layer is higher than a height of the vertical interface of the substrate in a vertical direction;
 wherein the channel layer includes a first polar face at a portion of the interface between the channel layer and the channel supply layer, wherein a vertical two-dimensional electron gas 2DEG is formed in the channel layer, and the 2DEG is adjacent to the first polar face.

2. The semiconductor device according to claim 1, wherein the vertical interface includes a crystalline lattice of a hexagonal symmetry.

3. The semiconductor device according to claim 1, wherein the substrate is a Si substrate, and the vertical interface is a (111) plane of Si.

4. The semiconductor device according to claim 1, wherein the substrate is an $Al_2O_3$ sapphire substrate, and the vertical interface is a (0001) plane of $Al_2O_3$.

5. The semiconductor device according to claim 1, wherein the substrate is a SiC substrate, and the vertical interface is a (0001) plane or a (000-1) plane of SiC.

6. The semiconductor device according to claim 1, wherein the channel layer includes a second polar face at a portion of the interface between the channel layer and the channel supply layer, wherein a vertical two- dimensional hole gas 2DHG is formed in the channel layer, and the 2DHG is adjacent to the second polar face.

7. The semiconductor device according to claim 6, wherein one or more electrodes are formed outside of the channel supply layer adjacent to the 2DHG region.

8. The semiconductor device according to claim 1, wherein the channel layer includes a first polar face at a first portion of the interface between the channel layer and the channel supply layer and a second polar face at a second portion of the interface between the channel layer and the channel supply layer, wherein a 2DEG is in the channel layer and adjacent to the first polar face, and a 2DHG is in the channel layer and adjacent to the second polar face.

9. The semiconductor device according to claim 1, further comprising a nucleation layer on the vertical interface of the substrate.

10. The semiconductor device according to claim 1, further comprising a nucleation layer, wherein the nucleation layer is located on the vertical interface of the substrate.

11. The semiconductor device according to claim 1, wherein a height of the channel layer is higher than a height of the substrate in a vertical direction.

12. The semiconductor device according to claim 1, wherein one or more electrodes are formed outside of the channel supply layer adjacent to the 2DEG region.

13. The semiconductor device according to claim 1, further comprising a insulating layer is located between the substrate and the channel layer as well as between the substrate and the channel supply layer.

14. A method of fabricating a semiconductor device, comprising the steps of:
 forming a vertical interface on a substrate, wherein the substrate is a heterogeneous substrate;
 forming a buffer layer from a hexagonal symmetry surface outside the vertical interface, wherein a height of the buffer layer is higher than a height of the vertical interface of the substrate in a vertical direction;
 forming a semiconductor channel layer outside the vertical interface, wherein the semiconductor channel layer includes at least one of a (0001) polar face or a (000-1) polar face of a III-V compound semiconductor; and forming a semiconductor channel supply layer outside the channel layer;

wherein a vertical two-dimensional carrier gas is formed in the semiconductor channel layer adjacent to an interface between the semiconductor channel layer and the semiconductor channel supply layer.

15. The method according to claim 14, further comprising forming insulating layers on the substrate.

16. The method according to claim 14, further comprising forming a nucleation layer on the vertical interface.

17. A semiconductor device, comprising:
a column having a sidewall surface; and
one or more electrodes disposed on the side wall surface of the column;
a semiconductor substrate having a vertical interface, wherein the column is formed overlaying the vertical interface of the semiconductor substrate;
wherein the column includes a buffer layer and a channel layer over the buffer layer, the buffer layer epitaxially grown from a hexagonal symmetry surface between the semiconductor substrate and the channel layer;
wherein a height of the buffer layer is higher than a height of the vertical interface of the semiconductor substrate in a vertical direction;
wherein the channel layer of the column includes at least one of a two-dimensional electron gas (2DEG) region and a two-dimensional hole gas (2DHG) region adjacent to the sidewall surface;
wherein the sidewall surface of the column includes at least one of a (0001) polar face or a (000-1) polar face of a III-V compound semiconductor.

18. The semiconductor device according to claim 17, wherein the column includes a first sidewall surface and a second sidewall surface, wherein the 2DEG is adjacent to the first sidewall surface and the 2DHG is adjacent to the second sidewall surface.

19. The semiconductor device according to claim 17, wherein the column comprises:
a channel layer; and
a channel supply layer at least partially overlaying a sidewall surface of the channel layer.

20. A semiconductor device, comprising:
a semiconductor substrate having a vertical interface, wherein the substrate is a heterogeneous substrate;
a channel layer disposed outside the vertical interface and laterally with respect to the vertical interface, wherein the channel layer is a GaN-based material;
a channel supply layer disposed outside the channel layer; and
a buffer layer epitaxially growing from a hexagonal symmetry surface between the substrate and the channel layer, the buffer layer laterally between the vertical interface and the channel layer;
wherein at least one vertical two-dimensional carrier gas is formed in the channel layer adjacent to an interface between the channel layer and the channel supply layer;
wherein a height of the buffer layer is higher than a height of the vertical interface of the substrate in a vertical direction;
wherein the channel layer includes a second polar face at a portion of the interface between the channel layer and the channel supply layer, wherein a vertical two-dimensional hole gas 2DHG is formed in the channel layer, and the 2DHG is adjacent to the second polar face.

21. A semiconductor device, comprising:
a semiconductor substrate having a vertical interface, wherein the substrate is a heterogeneous substrate;
a channel layer disposed outside the vertical interface and laterally with respect to the vertical interface, wherein the channel layer is a GaN-based material;
a channel supply layer disposed outside the channel layer; and
a buffer layer epitaxially growing from a hexagonal symmetry surface between the substrate and the channel layer, the buffer layer laterally between the vertical interface and the channel layer;
wherein at least one vertical two-dimensional carrier gas is formed in the channel layer adjacent to an interface between the channel layer and the channel supply layer;
wherein a height of the buffer layer is higher than a height of the vertical interface of the substrate in a vertical direction;
wherein the channel layer includes a first polar face at a first portion of the interface between the channel layer and the channel supply layer and a second polar face at a second portion of the interface between the channel layer and the channel supply layer, wherein a 2DEG is in the channel layer and adjacent to the first polar face, and a 2DHG is in the channel layer and adjacent to the second polar face.

* * * * *